(12) United States Patent
Yan et al.

(10) Patent No.: US 11,764,313 B2
(45) Date of Patent: Sep. 19, 2023

(54) PHOTOVOLTAIC SOLAR CELL, SOLAR CELL MODULE AND MANUFACTURING PROCESS

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Xunlei Yan, Zhejiang (CN); Kun Yu, Zhejiang (CN); Changming Liu, Zhejiang (CN); Xinyu Zhang, Zhejiang (CN)

(73) Assignees: Shanghai Jinko Green Energy Enterprise Management Co., Ltd., Shanghai (CN); Zhejiang Jinko Solar Co., Ltd., Haining (CN)

(*) Notice: Subject to any disclaimer, the term of this patent is extended or adjusted under 35 U.S.C. 154(b) by 0 days.

(21) Appl. No.: 17/522,536

(22) Filed: Nov. 9, 2021

(65) Prior Publication Data

US 2023/0066620 A1 Mar. 2, 2023

(30) Foreign Application Priority Data

Aug. 27, 2021 (CN) .......................... 202110998160.X

(51) Int. Cl.
*H01L 31/02* (2006.01)
*H01L 31/0224* (2006.01)
*H01L 31/18* (2006.01)

(52) U.S. Cl.
CPC ...... *H01L 31/0201* (2013.01); *H01L 31/0224* (2013.01); *H01L 31/18* (2013.01)

(58) Field of Classification Search
CPC ......... H01L 31/022425; H01L 31/0201; H01L 31/05
See application file for complete search history.

(56) References Cited

U.S. PATENT DOCUMENTS

2014/0318613 A1 10/2014 Von Campe et al.
2015/0090334 A1* 4/2015 Han .................... H01L 31/0201
136/256
(Continued)

FOREIGN PATENT DOCUMENTS

CN 103280465 A 9/2013
CN 104321883 A 1/2015
(Continued)

OTHER PUBLICATIONS

Machine translation for CN 11211200.*
(Continued)

*Primary Examiner* — Bethany L Martin
(74) *Attorney, Agent, or Firm* — Knobbe Martens Olson & Bear LLP

(57) ABSTRACT

Provided is a photovoltaic solar cell, a solar cell module and a manufacturing process. The photovoltaic solar cell includes a silicon substrate, and a passivation layer located on at least one surface of the silicon substrate. An electrode, an electrode pad and an extension line are printed on at least one surface of the silicon substrate. The electrode includes a busbar and a finger crossed with each other, and the finger is in contact with the silicon substrate. Two ends of the extension line are respectively connected to the busbar and the electrode pad, and the extension line is in contact with the silicon substrate.

17 Claims, 5 Drawing Sheets

(56) References Cited

U.S. PATENT DOCUMENTS

| | | | |
|---|---|---|---|
| 2019/0103500 A1* | 4/2019 | Lee | H01L 31/0504 |
| 2019/0305162 A1 | 10/2019 | Kim et al. | |
| 2020/0075788 A1* | 3/2020 | Oh | H01L 31/0201 |
| 2020/0373448 A1 | 11/2020 | Kyeong et al. | |

FOREIGN PATENT DOCUMENTS

| | | | |
|---|---|---|---|
| CN | 105304742 A | | 2/2016 |
| CN | 109300998 A | | 2/2019 |
| CN | 111211200 A | * | 5/2020 |
| CN | 111211200 A | | 5/2020 |
| CN | 211265490 U | | 8/2020 |
| CN | 112234109 A | | 1/2021 |
| CN | 212848425 U | | 3/2021 |
| CN | 213459753 U | | 6/2021 |
| CN | 213660425 U | | 7/2021 |
| CN | 113302746 A | | 8/2021 |
| DE | 202015004065 U1 | | 7/2015 |
| JP | 2010147107 A | | 7/2010 |
| JP | 2015523707 A | | 8/2015 |
| JP | 2018093167 A | | 6/2018 |
| KR | 20160019317 A | | 2/2016 |
| KR | 20180090510 A | | 8/2018 |
| WO | WO 2012077568 A1 | | 6/2012 |
| WO | WO2013/090562 A2 | | 6/2013 |
| WO | WO2017/128668 A1 | | 8/2017 |
| WO | WO 2018235202 A1 | | 12/2018 |

OTHER PUBLICATIONS

Non-Final Office Action in Japanese Application No. 2021/183354 dated Dec. 3, 2021 in 15 pages.

Extended European Search Report for EP Application No. 21207556.8, dated Apr. 26, 2022, in 7 pages.

Patent Decision of Japanese Application No. 2021-183354, dated Apr. 26, 2022, in 5 pages.

Australian Examination Report received in Australian Application No. 2021266207 dated Nov. 9, 2022 in 7 pages.

Office Action received in Chinese Application No. 202110998160.X dated Jul. 1, 2023 in 8 pages.

* cited by examiner

PHOTOVOLTAIC SOLAR CELL, SOLAR CELL MODULE AND MANUFACTURING PROCESS

CROSS-REFERENCE TO RELATED APPLICATIONS

The present application claims priority to Chinese Patent Application No. 202110998160.X, filed on Aug. 27, 2021, the content of which is incorporated herein by reference in its entirety.

TECHNICAL FIELD

The present disclosure relates to the field of photovoltaic cell technologies, and in particular, to a photovoltaic solar cell, a solar cell module and a manufacturing process thereof.

BACKGROUND

With the reduction in costs of photovoltaic cells, reduction in metallization unit consumption is an inevitable trend. For the multi-busbar technology, an area of an electrode pad is reduced while more busbars may be used, so as to reduce unit consumption. However, a small electrode pad is difficult to ensure reliability of a connection with the busbar, and current collection capability is also reduced.

SUMMARY

An objective of the present disclosure is to provide a photovoltaic solar cell, a solar cell module and a manufacturing process, so as to solve the problem in the related art that reduction in an area of an electrode pad cannot simultaneously reduce unit consumption and ensure reliability of a connection between the electrode pad and a busbar.

In a first aspect, a photovoltaic solar cell is provided. The photovoltaic solar cell includes a silicon substrate, a passivation layer located on at least one surface of the silicon substrate, and an electrode, an electrode pad and an extension line printed on at least one surface of the silicon substrate. The electrode including a busbar and a finger crossed with each other, and the finger is in contact with the silicon substrate. Two ends of the extension line is connected to the busbar and the electrode pad, respectively, and the extension line is in contact with the silicon substrate.

In one or more embodiment, both the busbar and the electrode pad is not in contact with the silicon substrate.

In one or more embodiment, a size of the extension line is less than or equal to 3 times of a size of the electrode pad in a direction of an elongation line of the busbar.

In one or more embodiment, a partial region of the extension line overlaps with the busbar, and a size of an overlapping region of the extension line and the busbar is less than 0.1 mm in a direction of an elongation line of the busbar. A partial region of the extension line overlaps with the electrode pad, and a size of an overlapping region between the extension line and the electrode pad is less than 0.1 mm in the direction of an elongation line of the busbar.

In one or more embodiment, a width of the extension line is 1 to 2 times of a width of the busbar.

In one or more embodiment, the extension line is in a shape of one of a rectangle, a trapezoid and an ellipse or combinations thereof.

In one or more embodiment, a height of the extension line decreases gradually along a direction from the electrode pad to the busbar.

In a second aspect, a photovoltaic module is provided. The photovoltaic module includes a glass, a first film material, a photovoltaic cell string, a second film material, and a back sheet sequentially from front to back. The photovoltaic cell string includes a plurality of photovoltaic solar cells, and at least one of the plurality of photovoltaic solar cells is the photovoltaic solar cell described according to the first aspect.

In a third aspect, a manufacturing process for manufacturing the photovoltaic solar cell according to the first aspect is provided. The manufacturing process includes: providing a photovoltaic substrate having a passivation layer on at least one surface; printing an electrode pad and a busbar on the photovoltaic substrate by using a non fire-through paste; and printing an extension line and a finger on the photovoltaic substrate by using a fire-through paste, to enable the extension line to be connected to the electrode pad and the busbar, respectively.

It is to be understood that the general description above and the detailed description in the following are merely illustrative, and cannot limit the present disclosure.

Figure 1:
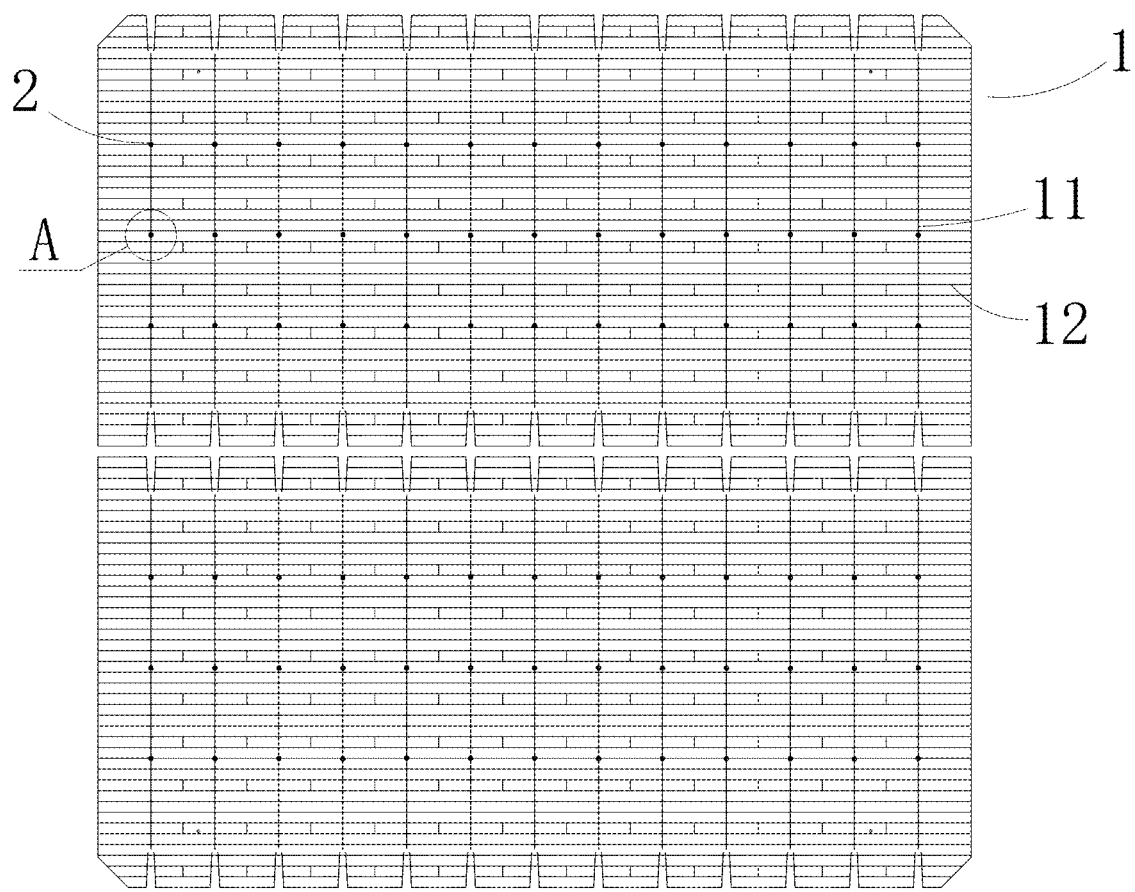
FIG. 1 is a schematic structural diagram of a photovoltaic solar cell according to one or more embodiments of the present disclosure.

REFERENCE SIGNS a: overlapping region; 1: photovoltaic solar cell; 2: electrode pad; 3: extension line; 4: glass; 5: first film material; 6: photovoltaic cell string; 7: second film material; 8: back sheet; 11: busbar; 12: finger; 101: front electrode; 102: passivation layer; 103: emitter; 104: silicon substrate; 105: tunnel oxide layer; 106: doped poly silicon doped layer; 107: rear passivation layer; 108: rear electrode.

The accompanying drawings herein, which are incorporated in and constitute a part of this specification, illustrate embodiments consistent with the present disclosure and, together with the specification, serve to explain principles of the present disclosure.

DESCRIPTION OF EMBODIMENTS

In order to make the objectives, technical solutions and advantages of the present disclosure more clearly understood, the present disclosure is described in further detail below with reference to embodiments and the accompanying drawings. It should be understood that specific embodiments described herein are intended only to interpret the present disclosure and not intended to limit the present disclosure.

In the description of the present disclosure, unless otherwise expressly specified and qualified, the terms "first" and "second" are used for descriptive purposes only, which cannot be construed as indicating or implying a relative importance. The term "a plurality of" means two or more, unless otherwise specified or stated. The terms such as "connection" and "fixing" should be understood in a broad way. For example, "connection" may be a fixed connection, a detachable connection, or an integral connection, or an electrical connection; a direct connection or an indirect connection through an intermediate medium. For those of ordinary skill in the art, the specific meanings of the foregoing terms in the present disclosure can be understood on a case-by-case basis.

In the description of the specification, it is to be understood that orientation words such as "above" and "below" described in the embodiments of the present disclosure are described from the angles as shown in the accompanying drawings and should not be understood as limitations on the embodiments of the present disclosure. In addition, in the context, it is to be further understood that, when one element is connected "above" or "below" another element, it can be directly connected "above" or "below" another element, and can be indirectly connected "above" or "below" another element through an intermediate element.

With the reduction in costs of photovoltaic cells, there is still large improvement to reduce the metallization unit consumption, which is also an inevitable trend to reduce the costs of the photovoltaic cells. An existing multi-busbar technology is relatively mature. For the multi-busbar technology, an area of an electrode pad is reduced while more busbars may be used, so as to reduce the unit consumption. Although the reduction in the area of the electrode pad can reduce the unit consumption, a small electrode pad is difficult to ensure reliability of a connection with the busbar, and current collection capability is also reduced. As a result, the reduction in the unit consumption, the reliability of the connection between the electrode pad and the busbar and the current collection capability cannot be guaranteed at the same time.

Figure 5:
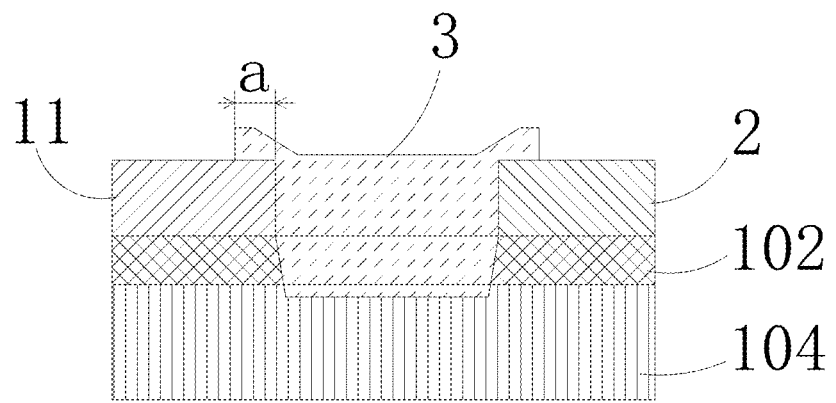
FIG. 5 is a state diagram (III) of the connections of the electrode pad, the extension line and the busbar.
Figure 6:
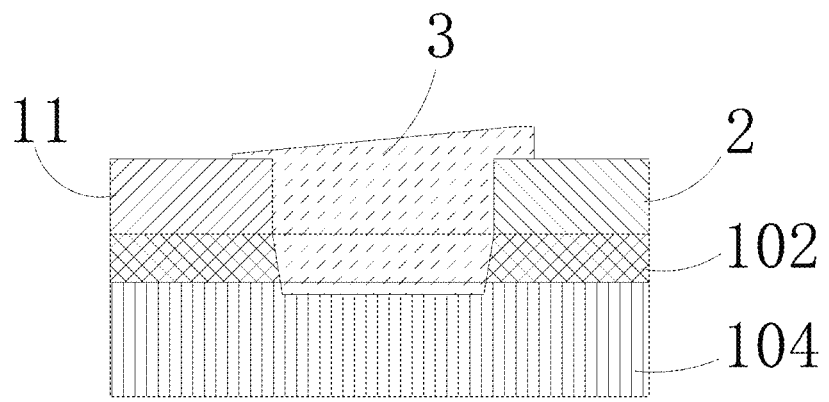
FIG. 6 is a state diagram (IV) of the connections of the electrode pad, the extension line and the busbar.
Figure 7:
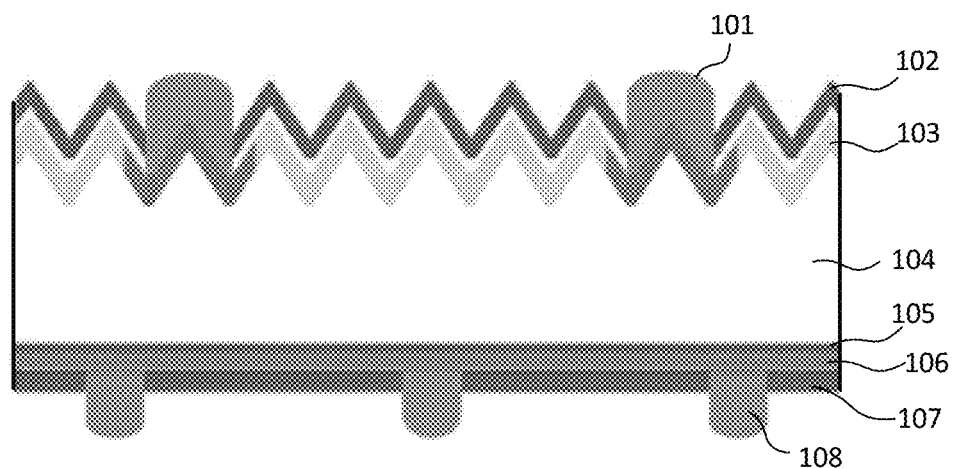
FIG. 7 is a schematic cross-sectional view of a photovoltaic solar cell according to one or more embodiments of the present disclosure.

To this end, as shown in FIG. 1 to FIG. 7, one or more embodiments of the present disclosure provides a photovoltaic solar cell 1, including a silicon substrate and a passivation layer located on at least one surface of the silicon substrate. The photovoltaic solar cell 1 may be a tunnel oxide passivated contact (TOPcon) cell. As shown in FIG. 7, the solar cell includes a front electrode 101, a front passivation layer 102, an emitter 103, an N-type silicon substrate 104, a tunnel oxide layer 105, a doped poly silicon doped layer 106, a rear passivation layer 107 and a rear electrode 108 sequentially from front to back.

In some embodiments, an electrode, an electrode pad 2 and an extension line 3 are printed on at least one surface of the silicon substrate of the photovoltaic solar cell 1. The electrode, the electrode pad 2 and the extension line 3 are printed on both the front and back surfaces of the silicon substrate when the photovoltaic solar cell 1 is the TOPcon cell. When the photovoltaic solar cell 1 is a passivated emitter and rear cell (PERC), the electrode, the electrode pad 2 and the extension line 3 are printed on a front surface of the PERC cell.

The electrode includes a busbar 11 and a finger 12 crossed with each other, and the finger 12 is in contact with the silicon substrate. Two ends of the extension line 3 are connected to the busbar and the electrode pad 2, respectively, and the extension line 3 is in contact with the silicon substrate.

The extension line 3 may realize a connection between the busbar 11 and the electrode pad 2, and may maintain direct contact with the silicon substrate. In some embodiments, a fire-through paste may be printed by a screen printing process so that the paste passes through the passivation layer to contact the silicon substrate. Alternatively, by laser drilling, the passivation layer in a region of the extension line prior to paste printing is enabled to have an opening to accommodate the extension line. Alternatively, the extension line in contact with the silicon substrate is directly obtained by laser transfer printing. Such methods can all ensure the reliability of the connection with the electrode pad 2 and the busbar 11 and ensure the current collection capability of the electrode pad 2.

Further, it is to be noted that, for a solar cell that uses a metal electrode to conduct electricity, a thickness of the metal electrode tends to be reduced so as to reduce costs. However, with the reduction in the thickness of the metal electrode, a contact part between a conductive line and the electrode after welding, especially a contact part between the conductive line and the busbar, includes tin silver alloy or other alloy substances. As a result, the busbar may be eroded by a welding alloy layer. In the case of welding, a temperature at the electrode pad is the highest, leading to a greater number of welding alloys near the electrode pad, so that a thickness of the busbar at a junction with the electrode pad is reduced, and the busbar is most likely to break, which may bring adverse effect to the current collection and performing badly in electroluminescence (EL) test. In addition, an existing busbar and the electrode pad are integrally designed, and the electrode pad has a long transverse length. The busbar and the electrode pad are located above the passivation layer and do not contact the silicon substrate, and only a finger contacts the silicon substrate, which is easy to cause grid breakage at a junction between the busbar and the electrode pad.

To this end, with the photovoltaic solar cell 1 according to embodiments of the present disclosure, the extension line 3 may be connected to the electrode and the electrode pad 2, respectively, so as to enhance the connection between the electrode pad 2 and the electrode through the extension line 3. Moreover, the extension line 3 directly contacts the silicon substrate, so that a portion of the extension line 3 in contact with the silicon substrate may not break even if the electrode is eroded by the welding alloy and results in a reduced thickness. That is, the extension line 3 can always maintain the connection with the electrode and the electrode pad 2, so as to ensure the current collection capability.

Thus, compared with the related art, the photovoltaic solar cell 1 according to embodiments of the present disclosure reduces unit consumption of the solar cell, which can also ensure reliability of the connection between the electrode pad 2 and the busbar 11 and, at the same time, can still ensure effective current collection capability in a case where a junction between the electrode and the electrode pad 2 is eroded by the welding alloy.

Figure 2:
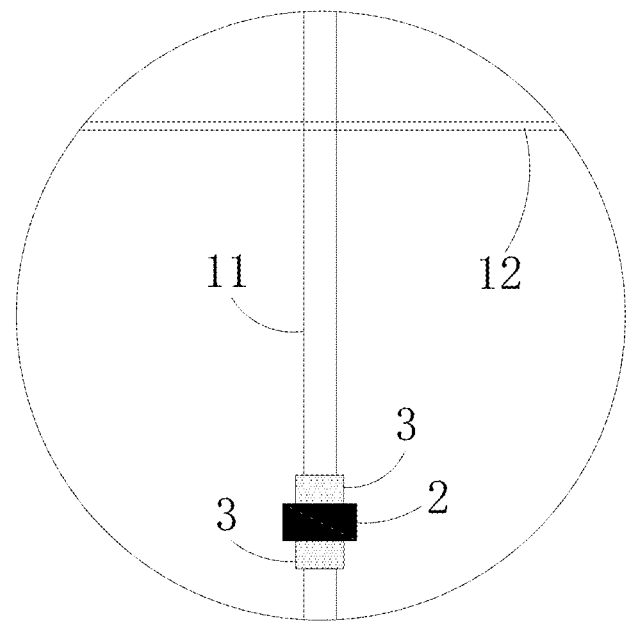
FIG. 2 is a partial enlarged view of A in FIG. 1.
Figure 3:
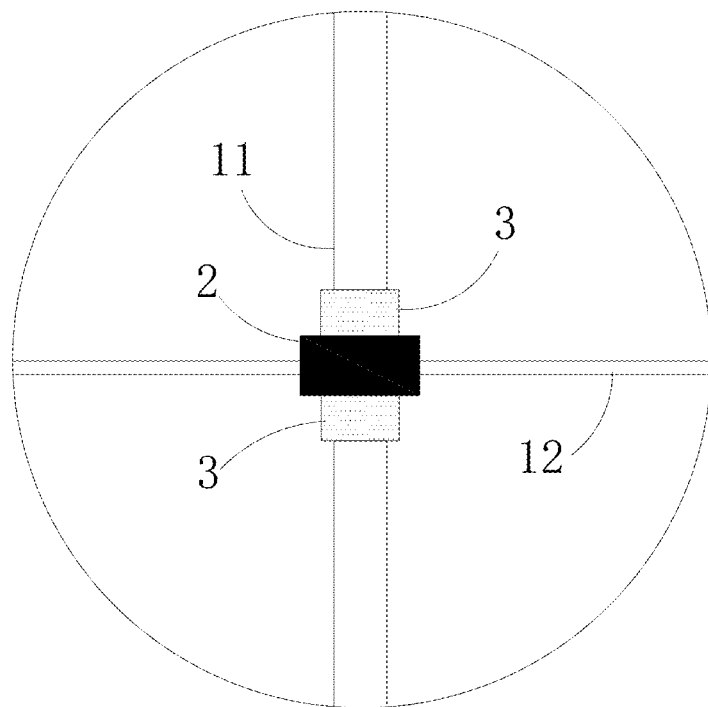
FIG. 3 is a state diagram (I) of connections of an electrode pad, an extension line and a busbar.

As shown in FIG. 2, neither the busbar 11 nor the electrode pad 2 is in contact with the silicon substrate, and the electrode pad 2 may be located away from the finger 12. It is to be understood that the busbar 11 is vulnerable to erosion of the welding alloy and a part vulnerable to grid breakage is located at a junction between the busbar 11 and the electrode pad 2. In some embodiments, the electrode pad 2 is connected to the busbar 11 through the extension line 3, and the extension line 3 may be printed on the silicon substrate by a screen printing process, so that it is not easy to break, which may enhance the connection between the electrode and the electrode pad 2, and prevent the problem of grid breakage. In addition, the finger 12 may also be located on two sides of the electrode pad 2, as shown in FIG. 3.

In some embodiments, a size of the extension line 3 is less than or equal to 3 times of a size of the electrode pad 2 in a direction of the elongation line of the busbar 11. It is to be noted that the electrode pad and a conductive line are welded by a press-down action of a bank of probes of a welding machine, and a welding alloy may be formed in a region near the probes. The size of the extension line 3 being less than or equal to 3 times the size of the electrode pad 2 may prevent an excessive area of the welding alloy in the region near the probes, thereby reducing the risk of grid breakage of the busbar.

In some embodiment as shown in FIG. 5 and FIG. 6, a partial region of the extension line 3 overlaps with the busbar 11, and a size of an overlapping region a between the extension line 3 and the busbar 11 is less than 0.1 mm in a direction of the elongation line of the busbar 11. It is to be noted that in the direction of the elongation line of the busbar 11, if the size of the overlapping region a between the extension line 3 and the busbar 11 is too large, a height of the overlapping region between the extension line 3 and the busbar 11 may be large, which affects alignment of a relative position between the busbar 11 and the conductive line. If the conductive line is offset to one side of the busbar 11, the height of the finger 12 near an offset position of the busbar 11 may be reduced. In some embodiments, a partial region of the extension line 3 overlaps with the electrode pad 2, and a size of an overlapping region between the extension line 3 and the electrode pad 2 is less than 0.1 mm in the direction of the elongation line of the busbar 11. It is to be noted that in the direction of the elongation line of the busbar 11, if the size of the overlapping region a between the extension line 3 and the electrode pad 2 is too large or the extension line 3 runs through the electrode pad 2, a height of the overlapping region between the extension line 3 and the electrode pad 2 may be large, which affects alignment of a relative position between the busbar 11 and the conductive line. If the conductive line is offset to one side of the busbar 11, the height of the finger 12 near an offset position of the busbar 11 may be reduced. In some embodiments, a width of the extension line 3 is 1 to 2 times of a width of the busbar 11. The extension line 3 has a larger width than the busbar 11, so as to further enhance the reliability of the connection of the extension line 3 with the busbar 11 and the electrode pad 2 while improving the current collection capability.

Figure 4:
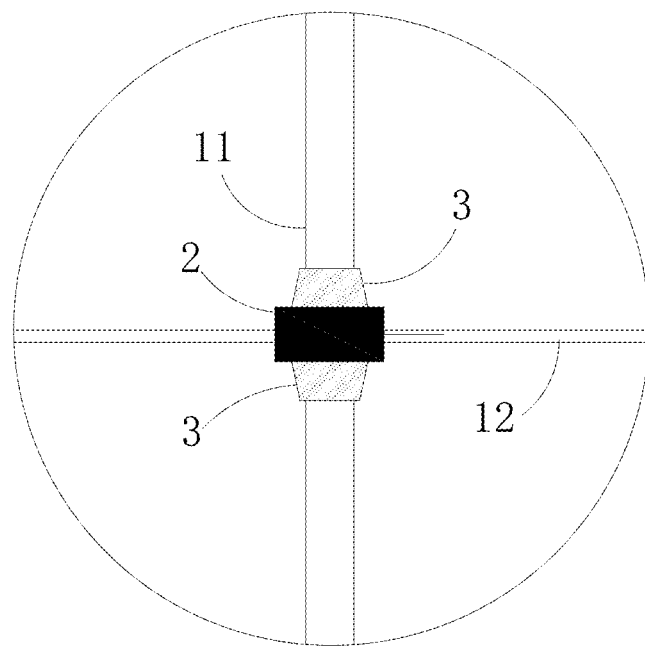
FIG. 4 is a state diagram (II) of the connections of the electrode pad, the extension line and the busbar.

The extension line 3 may be in a shape of a trapezoid, an H section, a Herringbone pattern, a rectangle or an ellipse. Since the width of the electrode pad 2 is greater than that of the busbar 11, strength of the connection with the electrode pad 2 may be enhanced by connecting a wider end of the extension line 3 with the electrode pad 2. In some embodiments, the extension line 3 may also be in other shapes. In some embodiments, the extension line may be in the shape of a trapezoid. As shown in FIG. 4, the extension line 3 in the shape of a trapezoid has a wider end connected to the electrode pad 2 and a narrower end connected to the busbar 11.

In some embodiments, a height of the extension line 3 decreases gradually from the electrode pad 2 to the direction of the busbar 11. The height of the extension line 3 decreasing gradually from the electrode pad 2 to the direction of the busbar 11 may enhance the reliability of the connection between the extension line 3 and the electrode pad 2, may further enhance the current collection capability. That is, the current collection capability is stronger at a position of the extension line 3 closer to the larger height of the electrode pad 2, and at the same time, this may also prevent grid breakage.

In some embodiments, a height of the two ends of the extension line 3 may be greater than a height of a middle region, so as to enhance the reliability of the connection of the extension line 3 with the electrode pad 2 and the busbar 11.

It is to be noted that the photovoltaic solar cell 1 may be an N-type or P-type photovoltaic solar cell 1, and the silicon substrate is an N-type silicon substrate or a P-type silicon substrate. In some embodiments, the photovoltaic solar cell 1 may be an N-type photovoltaic solar cell 1, and the silicon substrate may be an N-type silicon substrate.

In some embodiments, the busbar has a height less than or equal to 8 μm, so as to reduce the unit consumption.

In some embodiments, when the photovoltaic solar cell 1 is an N-type photovoltaic solar cell, an electrode on a front surface of the N-type photovoltaic solar cell has a width less than 30 μm, and an electrode on a back surface of the N-type photovoltaic solar cell has a width less than 37 μm. Since the back surface of the N-type photovoltaic solar cell is relatively smooth, the electrode on the back surface of the N-type photovoltaic solar cell having a width greater than that on the front surface enables the connection of the electrode on the back surface of the N-type photovoltaic solar cell to be more reliable.

In some embodiments, for the N-type photovoltaic solar cell, the height of electrode pad 2 is greater than or equal to 5 μm and less than or equal to 7 μm. The current collection capability can be ensured and the unit consumption can be reduced within the range of the height.

In some embodiments, for the N-type photovoltaic solar cell, a thickness of the electrode pad 2 is less than that of the electrode.

In some embodiments, at least part of position projections of electrode pads on the front surface of the N-type photovoltaic solar cell do not overlap with at least part of position projections of electrode pads on the back surface of the N-type photovoltaic solar cell. Thus, it can play an effect of equally dividing lamination load and reduce process debris rate.

In some embodiments, the electrode pad 2 includes a hollow region, and in a direction parallel to the N-type photovoltaic solar cell, an area of the hollow region is less than 30% of a total area of the electrode pad 2. Thus, the unit consumption may be reduced while the current collection capability may be ensured.

In some embodiments, in order to achieve low unit consumption, an area of a non-hollow region of the electrode pad 2 is less than or equal to 0.3 mm$^2$ in the direction parallel to the N-type photovoltaic solar cell.

In some embodiments, a length of the electrode pad 2 in a direction perpendicular to the busbar 11 is greater than that of the electrode pad 2 in a direction parallel to the busbar 11.

In some embodiments, a number of the busbar 11 is greater than or equal to 9 and less than or equal to 18. Thus, the photovoltaic solar cell 1 may have relatively strong current collection capability.

Figure 8:
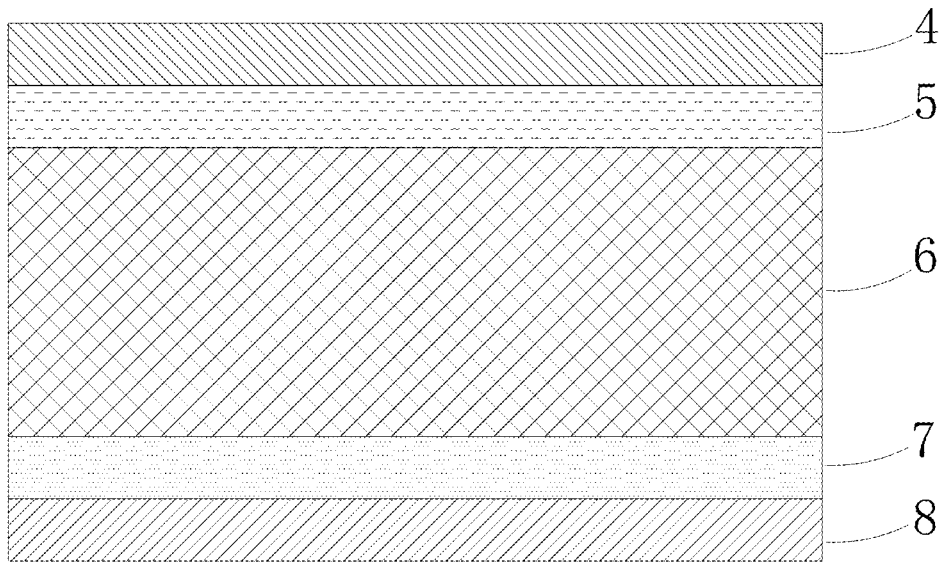
FIG. 8 is a schematic structural diagram of a photovoltaic module according to one or more embodiments of the present disclosure.

As shown in FIG. 8, one or more embodiments of the present disclosure further provides a photovoltaic module. The photovoltaic module includes glass 4, a first film material 5, a photovoltaic cell string 6, a second film material 7 and a back sheet 8 sequentially from front to back. The photovoltaic cell string includes a plurality of photovoltaic cells, and the photovoltaic cell is the photovoltaic solar cell 1 according to any of the embodiments described as above. The photovoltaic module is an N-type photovoltaic module.

The photovoltaic solar cells 1 are connected through a conductive line, and the conductive line has a diameter of 0.2 mm to 0.3 mm. The N-type photovoltaic solar cell 1 according to embodiments of the present disclosure can further reduce the size of the electrode pad 2, so that a width of the conductive line connected to the electrode pad 2 may be further reduced, which facilitates the arrangement of more busbars 11 and enhances the current collection capability.

Figure 9:
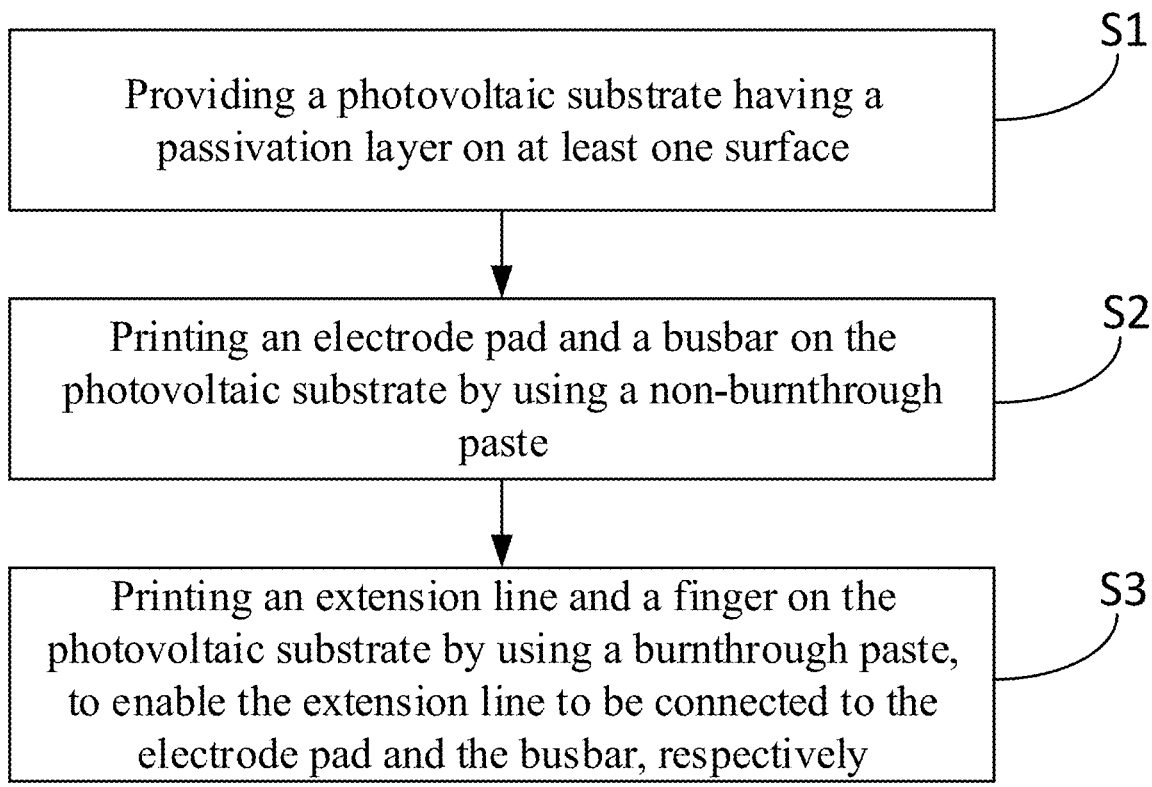
FIG. 9 is a flowchart of a manufacturing process according to one or more embodiments of the present disclosure.

As shown in FIG. 9, one or more embodiments of the present disclosure further provides a manufacturing process for manufacturing the photovoltaic solar cell according to any of the embodiments described as above. The process includes the following steps.

In step S1, a photovoltaic substrate having a passivation layer on at least one surface is provided.

In step S2, an electrode pad and a busbar are respectively printed on the photovoltaic substrate by using a non fire-through paste.

The non fire-through paste may be a silver paste, a silver-aluminum or the like. Same or different pastes may be used in the electrode pad and the busbar. In a printing operation, the electrode pad may be printed first, followed by the busbar, or the electrode pad and the busbar may be printed at the same time.

In step S3, an extension line and a finger are respectively printed on the photovoltaic substrate by using a fire-through paste, so that the extension line is connected to the electrode pad and the busbar, respectively.

The fire-through paste may be a composite paste formed by silver powder, aluminum powder, glass powder and organics. Pastes for the extension line and the finger may be the same or different. In a printing operation, the extension line may be printed first, followed by the finger, or the extension line and the finger may be printed at the same time.

The fire-through paste is used in the extension line, so that the extension line can directly contact the silicon substrate, which effectively prevents grid breakage of the electrode due to erosion by the welding alloy and at the same time, and thus can enhance the current collection capability.

In some embodiments, the fire-through paste includes solid with a content of 88% to 92%, an organic matter with a content of 2% to 6%, and glass powder with a content of 2% to 6%. The solid includes silver powder with a content of 90% to 92%, aluminum powder with a content of 2% to 6% and trace metals or rare earth with a content of 2% to 6%.

The above are only some embodiments of the present disclosure and are not intended to limit the present disclosure. For those skilled in the art, the present disclosure may have various modifications and variations. Any modifications, equivalent substitutions, improvements and the like made within the spirit and principle of the present disclosure should fall within the protection scope of the present disclosure.

What is claimed is:

1. A photovoltaic solar cell, comprising:
   a silicon substrate;
   a passivation layer located on at least one surface of the silicon substrate; and
   an electrode, an electrode pad and an extension line printed on at least one surface of the silicon substrate,
   wherein the electrode comprises a busbar and a finger crossed with each other, and the finger is in contact with the silicon substrate, and
   wherein two ends of the extension line are respectively connected to the busbar and the electrode pad to reinforce a connection between the busbar and the electrode pad such that the extension line is not in direct contact with the finger, the extension line penetrates through the passivation layer and is in contact with the silicon substrate, and the busbar is not in direct contact with the silicon substrate, the electrode pad is not in direct contact with the silicon substrate.

2. The photovoltaic solar cell according to claim 1, wherein a size of the extension line is less than or equal to 3 times of a size of the electrode pad in a direction of an elongation line of the busbar.

3. The photovoltaic solar cell according to claim 1, wherein a partial region of the extension line overlaps with the busbar, and a size of an overlapping region of the extension line and the busbar is less than 0.1 mm in a direction of an elongation line of the busbar.

4. The photovoltaic solar cell according to claim 1, wherein a partial region of the extension line overlaps with the electrode pad, and a size of an overlapping region of the extension line and the electrode pad is less than 0.1 mm in the direction of an elongation line of the busbar.

5. The photovoltaic solar cell according to claim 1, wherein a width of the extension line is 1 to 2 times of a width of the busbar.

6. The photovoltaic solar cell according to claim 1, wherein the extension line is in a shape of one of a rectangle, a trapezoid and an ellipse or combinations thereof.

7. The photovoltaic solar cell according to claim 1, wherein a height of the extension line decreases gradually along a direction from the electrode pad to the busbar.

8. A photovoltaic module, comprising a glass, a first film material, a photovoltaic cell string, a second film material and a back sheet sequentially from front to back, wherein the photovoltaic cell string comprises a plurality of photovoltaic solar cells, and at least one of the plurality of photovoltaic solar cells comprises:
   a silicon substrate;
   a passivation layer located on at least one surface of the silicon substrate; and
   an electrode, an electrode pad and an extension line printed on at least one surface of the silicon substrate,
   wherein the electrode comprises a busbar and a finger crossed with each other, and the finger is in contact with the silicon substrate, and
   wherein two ends of the extension line are respectively connected to the busbar and the electrode pad to reinforce a connection between the busbar and the electrode pad such that the extension line is not in direct contact with the finger, the extension line penetrates through the passivation layer and is in contact with the silicon substrate, and the busbar is not in direct contact with the silicon substrate, the electrode pad is not in direct contact with the silicon substrate.

9. The photovoltaic module according to claim 8, wherein the plurality of photovoltaic solar cells are connected through a conductive line, and the conductive line has a diameter in a range of 0.2 mm to 0.3 mm.

10. The photovoltaic module according to claim 8, wherein a size of the extension line is less than or equal to 3 times of a size of the electrode pad in a direction of an elongation line of the busbar.

11. The photovoltaic module according to claim 8, wherein a partial region of the extension line overlaps with the busbar, and a size of an overlapping region of the extension line and the busbar is less than 0.1 mm in a direction of an elongation line of the busbar.

12. The photovoltaic module according to claim 8, wherein a partial region of the extension line overlaps with the electrode pad, and a size of an overlapping region of the extension line and the electrode pad is less than 0.1 mm in the direction of an elongation line of the busbar.

13. A manufacturing process for manufacturing a photovoltaic solar cell, the photovoltaic solar cell comprising:
- a silicon substrate;
- a passivation layer located on at least one surface of the silicon substrate; and
- an electrode, an electrode pad and an extension line printed on at least one surface of the silicon substrate,
- wherein the electrode comprises a busbar and a finger crossed with each other, and the finger is in contact with the silicon substrate, and
- wherein two ends of the extension line are respectively connected to the busbar and the electrode pad to reinforce a connection between the busbar and the electrode pad such that the extension line is not in direct contact with the finger, the extension line penetrates through the passivation layer and is in contact with the silicon substrate, and the busbar is not in direct contact with the silicon substrate, the electrode pad is not in direct contact with the silicon substrate, the manufacturing process comprising:
- providing a photovoltaic substrate having the passivation layer on the at least one surface of the silicon substrate;
- printing the electrode pad and the busbar on the photovoltaic substrate by using a non fire-through paste; and
- printing the extension line and the finger on the photovoltaic substrate by using a fire-through paste, to enable the extension line to be connected to the electrode pad and the busbar, respectively.

14. The manufacturing process according to claim 13, wherein different fire-through pastes are used for forming the extension line and the finger.

15. The manufacturing process according to claim 13, wherein a size of the extension line is less than or equal to 3 times of a size of the electrode pad in a direction of an elongation line of the busbar.

16. The manufacturing process according to claim 13, wherein a partial region of the extension line overlaps with the busbar, and a size of an overlapping region of the extension line and the busbar is less than 0.1 mm in a direction of an elongation line of the busbar.

17. The manufacturing process according to claim 13, wherein a partial region of the extension line overlaps with the electrode pad, and a size of an overlapping region of the extension line and the electrode pad is less than 0.1 mm in the direction of an elongation line of the busbar.

\* \* \* \* \*